(12) United States Patent
Tang et al.

(10) Patent No.: US 8,843,812 B1
(45) Date of Patent: Sep. 23, 2014

(54) BUFFER MANAGEMENT IN A TURBO EQUALIZATION SYSTEM

(75) Inventors: Xiangyu Tang, San Jose, CA (US); Yu Kou, San Jose, CA (US); Lingqi Zeng, Turlock, CA (US)

(73) Assignee: SK hynix memory solutions inc., San Jose, CA (US)

( * ) Notice: Subject to any disclaimer, the term of this patent is extended or adjusted under 35 U.S.C. 154(b) by 218 days.

(21) Appl. No.: 13/489,122

(22) Filed: Jun. 5, 2012

Related U.S. Application Data

(63) Continuation-in-part of application No. 13/405,331, filed on Feb. 26, 2012.

(60) Provisional application No. 61/466,789, filed on Mar. 23, 2011, provisional application No. 61/507,979, filed on Jul. 14, 2011.

(51) Int. Cl.
  *H03M 13/03* (2006.01)
  *H03M 13/00* (2006.01)
  *H03M 13/41* (2006.01)
  *H03M 13/29* (2006.01)

(52) U.S. Cl.
  CPC ........ *H03M 13/2963* (2013.01); *H03M 13/413* (2013.01)
  USPC .......................................... 714/795; 714/755

(58) Field of Classification Search
  CPC .......... H03M 13/2957; H03M 13/373; H03M 13/1105; H03M 13/2732; H03M 13/4138; H03M 13/3746; H03M 13/41; H03M 13/6343; H03M 13/2963; H03M 13/1111; H03M 13/2918; H03M 13/3738; H03M 13/413; H04L 1/0052; H04L 1/0057; H04L 1/0054; G11B 2020/185

USPC ................ 714/795, 801, 755, 780, 794, 796, 714/E11.032, 758, E11.034; 375/262, 341; 711/E12.008

See application file for complete search history.

(56) References Cited

U.S. PATENT DOCUMENTS

| | | | |
|---|---|---|---|
| 6,927,707 B2 * | 8/2005 | Nguyen et al. | 341/67 |
| 7,237,181 B2 * | 6/2007 | Richardson | 714/780 |
| 7,266,757 B1 * | 9/2007 | Mazahreh et al. | 714/794 |
| 7,730,377 B2 * | 6/2010 | Hocevar | 714/752 |
| 8,219,878 B1 * | 7/2012 | Varnica et al. | 714/758 |
| 8,312,354 B1 * | 11/2012 | Varnica et al. | 714/780 |
| 8,484,531 B1 * | 7/2013 | Varnica et al. | 714/758 |

(Continued)

OTHER PUBLICATIONS

Hagenauer et al., A Viterbi algorithm with soft-decision outputs and its applications., Proc. IEEE Global Telecommunications Conference Nov. 1989, pp. 1680-1686.

(Continued)

*Primary Examiner* — Phung M Chung
(74) *Attorney, Agent, or Firm* — Van Pelt, Yi & James LLP

(57) ABSTRACT

A plurality of metrics associated with a plurality of partially decoded codewords is obtained. The plurality of partially decoded codewords has been processed at least once by a first soft output decoder and a second soft output decoder and the plurality of partially decoded codewords is stored in a memory. At least one of the plurality of partially decoded codewords is selected based at least in part on the plurality of metrics; the memory is instructed to vacate the at least one selected codeword.

21 Claims, 9 Drawing Sheets

(56) References Cited

U.S. PATENT DOCUMENTS

| | | | |
|---:|---:|---|---|
| 8,601,338 | B2 * | 12/2013 | Kolze .......................... 714/752 |
| 2002/0124227 | A1 * | 9/2002 | Nguyen ........................ 714/786 |
| 2005/0273687 | A1 * | 12/2005 | Park et al. ..................... 714/752 |
| 2007/0089019 | A1 | 4/2007 | Tang et al. |
| 2007/0168832 | A1 | 7/2007 | Richardson et al. |
| 2008/0276156 | A1 | 11/2008 | Gunnam et al. |
| 2008/0301521 | A1 | 12/2008 | Gunnam et al. |
| 2011/0087946 | A1 | 4/2011 | Planjery et al. |
| 2011/0320902 | A1 | 12/2011 | Gunnam |

OTHER PUBLICATIONS

Koetter et al., Turbo Equalization an iterative equalization and decoding technique for coded data transmission., IEEE Signal Processing Magazine Jan. 2004, pp. 67-80.

Lee et al., Scheduling for an adaptive number of iterations in turbo equalizers combined with LDPC Decoders., IEEE Transactions on Communications, Oct. 2010, pp. 2759-2764 vol. 58, No. 10.

Zhao et al., A Ber performance-aware early termination scheme for layered LDPC Decoder., IEEE 2010, pp. 416-419.

Amador et al., Hybrid iteration control on LDPC Decoders., Sep. 2010.

* cited by examiner

| Entry | Decisions and Certainties (LLRs) | | | | Metric (# of unsatisfied parity checks) |
|---|---|---|---|---|---|
| 1 | -14 | 12 | 15 | -9 | 2 |
| 2 | 10 | 5 | -7 | -9 | 5 |
| 3 | 2 | -1 | 0 | 0 | 12 |
| 4 | (Empty) | | | | (Empty) |
| 5 | (Empty) | | | | (Empty) |
| 6 | (Empty) | | | | (Empty) |
| 7 | (Empty) | | | | (Empty) |
| 8 | (Empty) | | | | (Empty) |

Select next codeword for decoding by first soft output decoder

| Entry | Decisions and Certainties (LLRs) | | | | Metric (# of unsatisfied parity checks) 402 |
|---|---|---|---|---|---|
| 1 | -14 | 12 | 15 | -9 | 2 |
| 2 | 10 | 5 | -7 | -9 | 5 |
| 3 | 2 | -1 | 0 | 0 | 12 |
| 4 | -13 | 5 | -8 | 12 | 4 |
| 5 | 11 | 8 | 7 | 14 | 4 |
| 6 | 5 | 7 | -9 | -8 | 6 |
| 7 | -12 | -10 | 7 | 9 | 3 |
| 8 | (Empty) | | | | (Empty) |

404 → rows 2–4: Preemptively discard

FIG. 4

| Entry | Decisions and Certainties (LLRs) | | | | Metric (Average of \|LLR\|) |
|---|---|---|---|---|---|
| 1 | -14 | 12 | 15 | -9 | 12.5 |
| 2 | 10 | 5 | -7 | -9 | 7.75 |
| 3 | 2 | -1 | 0 | 0 | 0.75 |
| 4 | (Empty) | | | | (Empty) |
| 5 | (Empty) | | | | (Empty) |
| 6 | (Empty) | | | | (Empty) |
| 7 | (Empty) | | | | (Empty) |
| 8 | (Empty) | | | | (Empty) |

Select next codeword for decoding by first soft output decoder

| Entry | Decisions and Certainties (LLRs) | | | | Metric (Average of \|LLR\|) |
|---|---|---|---|---|---|
| 1 | -14 | 12 | 15 | -9 | 12.5 |
| 2 | 10 | 5 | -7 | -9 | 7.75 |
| 3 | 2 | -1 | 0 | 0 | 0.75 |
| 4 | -13 | 5 | -8 | 12 | 9.5 |
| 5 | 11 | 8 | 7 | 14 | 10 |
| 6 | 5 | 7 | -9 | -8 | 7.25 |
| 7 | -12 | -10 | 7 | 9 | 9.5 |
| 8 | (Empty) | | | | (Empty) |

604

Preemptively discard

BUFFER MANAGEMENT IN A TURBO EQUALIZATION SYSTEM

CROSS REFERENCE TO OTHER APPLICATIONS

This application is a continuation in part of co-pending U.S. patent application Ser. No. 13/405,331 entitled ADAPTIVE SCHEDULING OF TURBO EQUALIZATION BASED ON A METRIC filed Feb. 26, 2012, which in turn claims priority to U.S. Provisional Patent Application No. 61/466,789 entitled IMPROVED LDPC DECODING CONVERGENCE SPEED THROUGH ADAPTIVE SCHEDULING OF TURBO-EQUALIZATION filed Mar. 23, 2011; this application also claims priority to U.S. Provisional Patent Application No. 61/507,979 entitled USING NUMBER OF UNSATISFIED PARITY-CHECKS TO PREDICT HOW MANY ITERATIONS ARE NEEDED TO COMPLETE LDPC DECODING filed Jul. 14, 2011, all of the above being incorporated herein by reference for all purposes.

BACKGROUND OF THE INVENTION

Turbo equalization systems use two soft output decoders to process encoded codewords (e.g., they take turns processing a given codeword). Since the two decoders may operate at different speeds, buffers are used to store partially decoded codewords while the two decoders are busy with other codewords. Sometimes, the size of such buffers is fixed (e.g., because the turbo equalization system is implemented in hardware, such as an application-specific integrated circuit (ASIC), a field-programmable gate array (FPGA), or other semiconductor device). Under certain conditions, these buffers may overflow. For example, if one of the soft output decoders is performing multiple local iterations on a particular codeword (e.g., because there is a lot of noise or errors in that particular codeword) then a buffer may become full and additional codewords cannot be stored in the buffer, resulting in buffer overflow. Techniques for managing buffers that store partially decoded codewords in turbo equalization systems would be desirable.

BRIEF DESCRIPTION OF THE DRAWINGS

Various embodiments of the invention are disclosed in the following detailed description and the accompanying drawings.

FIG. 3 is a diagram showing an embodiment of a buffer in which a next codeword to be decoded is selected based on a number of unsatisfied parity checks.

FIG. 4 is a diagram showing an embodiment of a buffer in which a codeword is preemptively discarded based on a number of unsatisfied parity checks.

FIG. 5 is a diagram showing an embodiment of a buffer in which a next codeword to be decoded is selected based on an average of LLR magnitudes.

FIG. 6 is a diagram showing an embodiment of a buffer in which a codeword is preemptively discarded based on an average of LLR magnitudes.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
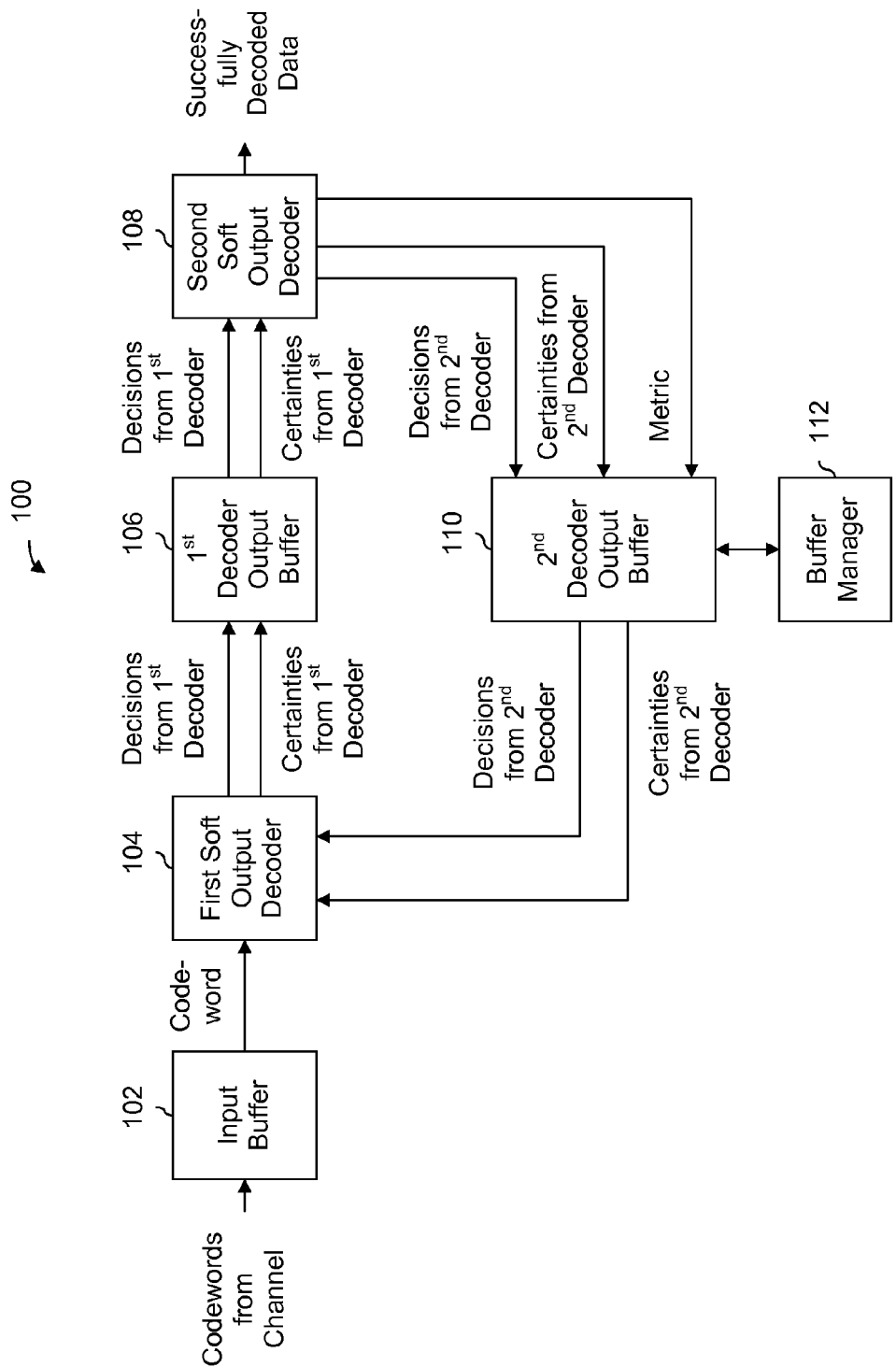
FIG. 1 is a diagram showing an embodiment of a turbo equalization system with buffer management.

FIG. 1 is a diagram showing an embodiment of a turbo equalization system with buffer management. In the example shown, turbo equalization system 100 processes codewords received from a channel. For example, if turbo equalization system 100 is used in a communications system and is included in a receiver, then the channel may be a wireless channel. Alternatively, turbo equalization system 100 may be used in a storage system and the channel is associated with storage, such as solid state storage (e.g., NAND Flash) or magnetic (e.g., hard disk drive) storage.

In turbo equalization, two soft output decoders (e.g., 104 and 108) take turns processing a particular codeword. Each soft output decoder may process a codeword one or more times before handing it off to the next decoder. The number of times a codeword is (e.g., successively) processed by a one decoder is referred to as local iterations; the number of local iterations performed by one decoder may not necessarily match the number of local iterations performed by the other decoder. One pass by both soft output decoders 104 and 108 is referred to as a global iteration. In one example, in a first global iteration, first soft output decoder 104 performs 4 local iterations on a given codeword and then second soft output decoder 108 performs 10 local iterations on the same codeword. In a second global iteration (because the codeword was not successfully decoded after the first global iteration), first soft output decoder 104 performs 6 local iterations on the codeword and then second soft output decoder 108 performs 5 local iterations on the codeword. For clarity, the explanation of turbo processing above is with respect to a given codeword and does not discuss what is going on at the same time with other codewords. In actuality, decoders 104 and/or 108 may be processing other codewords (e.g., out of order, in a non-FIFO manner).

Codewords from the channel are stored in input buffer 102. When first soft output decoder 104 is ready to process a codeword from input buffer 102, a codeword is output. In some embodiments, codewords are sent from input buffer 102 to first soft output decoder 104 in a first-in, first-out (FIFO) manner. In some embodiments, codewords are selected based on some criteria.

First soft output decoder 104 processes the codeword input to it and outputs decisions and certainties for the input codeword. In some embodiments, decoder 104 is a soft output Viterbi algorithm (SOVA) decoder. In some embodiments, some other decoder is used. In some embodiments, a decision is whether the decoder (e.g., 104 and/or 108) believes a particular bit (or, more generally, a symbol) in a codeword is a 1 or a 0 and the certainty represents how certain a decoder is in that decision. In some embodiments, decoder 104 and/or 108 output(s) a decision and corresponding certainty for each payload bit in a codeword (e.g., if a codeword has 12 bits total, of which 2 are payload or redundant bits, then the decoder outputs decisions and certainties for 10 bits). In some embodiments, decoder 104 and/or 108 output(s) log-likelihood ratio (LLR) values where the sign of the LLR value indicates the decision (e.g., a positive sign indicates a 1 decision and a negative sign indicates a 0 decision) and the magnitude indicates the certainty (e.g., the larger the magnitude, the greater the certainty).

The decisions and certainties for a codeword are passed from first soft output decoder 104 to first decoder output buffer 106 where they are stored until they are processed by second soft output decoder 108. In various embodiments, codewords are output from first decoder output buffer 106 in a variety of ways (e.g., FIFO, selected according to some criteria, etc.).

Second soft output decoder 108 inputs decisions and certainties for a given partially decoded codeword from buffer 106 and output its own decisions and certainties for that partially decoded codeword. In some embodiments, decoder 108 is a low-density parity-check (LDPC) decoder.

If second soft output decoder 108 is able to successfully decode the codeword, then the decoded information is output as successfully decoded data. If not, the decisions and certainties generated by second soft output decoder 108 for the partially decoded codeword are stored in second decoder output buffer 110.

In addition to decisions and certainties, second soft output decoder 108 generates a metric for each codeword. Decisions, certainties and metrics for partially decoded codewords are stored in second decoder output buffer 110. Some embodiments of metrics are described in further detail below.

Buffer manager 112 (e.g., when triggered by certain events occurring), uses the metrics to manage second decoder output buffer 110. In some embodiments, buffer manager 112 uses the metrics to discard one or more partially decoded codewords (in this figure, shown as decisions and certainties) from buffer 110 if buffer 110 gets too full. The codeword(s) discarded are selected based on their corresponding metrics and are expected or believed to have the least chance of being successfully decoded and/or require the most processing to properly decode. Put another way, in such embodiments, codewords that are the relatively far from being successfully decoded are selected to be preemptively discarded. In some embodiments, preemptively discarding codewords is triggered by buffer 110 reaching a certain capacity (e.g., 80% full, 90% full, etc.).

Preemptively discarded partially decoded codeword(s) in buffer 110 which is/are (relatively) far from being successfully decoded may be desirable because the system is getting rid of a codeword which may be impossible to decode or may require more global/local iterations than is desired. Furthermore, because such codewords will probably consume many global/local iterations (e.g., at first soft output decoder 104, which may be slower than second soft output decoder 108), such codewords could potentially cause the system to get "backed up," causing buffer overflow at buffer 110. In some embodiments, two or more partially decoded codewords stored in buffer 110 are preemptively discarded by buffer manager 112.

In some embodiments, buffer manager 112 uses the stored metrics to pick a next codeword to process when first soft output decoder 104 is ready for a next codeword from second decoder output buffer 110. For example, buffer manager may select the codeword having the metric indicating that it is the closest to finishing decoding.

Selecting a partially decoded codeword in buffer 110 with the best chance of being successfully decoded (i.e., to be processed next by first soft output decoder 104) may prevent or mitigate buffer overflow from occurring at buffer 110. For example, if first soft output decoder 104 is a SOVA decoder and second soft output decoder 108 is an LDPC decoder, SOVA decoders are typically slower than LDCP decoders and buffer 110 may be required to store multiple partially decoded codewords. By selecting a codeword (for processing by first soft output decoder 104) in buffer 110 with the best chance of being successfully decoded, the amount of processing time consumed by first soft output decoder 104 may be reduced, thus preventing the system from getting "backed up" and preventing or reducing the likelihood of a buffer overflow at buffer 110.

In some embodiments, turbo equalization system 100 is implemented as a semiconductor device, such as an application-specific integrated circuit (ASIC) or a field-programmable gate array (FPGA).

For clarity, some (e.g., application-specific) components or processing are not necessarily shown in this exemplary figure. For example, clock synchronization may be performed in magnetic storage applications and wireless communications applications and is not shown herein. The figure shown is merely exemplary and may include other components and processing.

Figure 2:
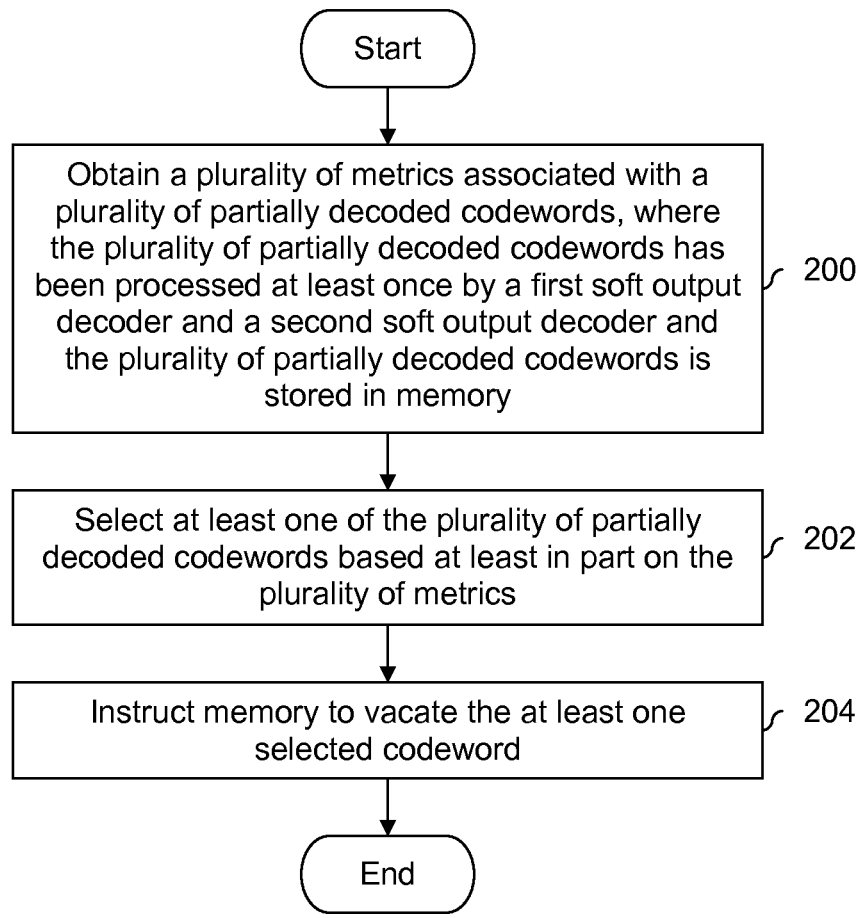
FIG. 2 is a flowchart illustrating an embodiment of a process for performing buffer management.

FIG. 2 is a flowchart illustrating an embodiment of a process for performing buffer management. In some embodiments the exemplary process is performed by buffer manager 112 on second decoder output buffer 110 in FIG. 1. In some embodiments, the process is triggered by some event occurring (e.g., first soft output decoder 104 it is ready for a next partially decoded codeword from buffer 110 in FIG. 1, buffer 110 is almost full, etc.).

At 200, a plurality of metrics associated with a plurality of partially decoded codewords is obtained, where the plurality of partially decoded codewords has been processed at least once by a first soft output decoder and a second soft output decoder and the plurality of partially decoded codewords is stored in memory. In some embodiments, a metric represents or estimates how close to being successfully decoded a corresponding partially decoded codeword is. For example, a first codeword which contains a large amount of noise or errors may have a metric indicating it is (e.g., relatively) far from being successfully decoded, whereas a second codeword with little noise or errors may have a metric indicating it is (e.g., relatively) close to being successfully decoded.

At 202, at least one of the plurality of partially decoded codewords is selected based at least in part on the plurality of metrics. For example, if first soft output decoder 104 in FIG. 1 is indicating it is ready for a next codeword from buffer 110, the codeword with the metric indicating it is the closest to being successfully decoded may be selected. Or, if buffer 110 in FIG. 1 is almost full, a codeword with the worst metric (i.e., indicating it is the furthest from being successfully decoded) is selected, or in some embodiments any codewords with metrics exceeding some threshold are selected to be discarded.

At 204, the memory is instructed to vacate the at least one selected codeword. For example, in FIG. 1, the selected codeword(s) may vacate buffer 110 to be processed by first soft output decoder 104, or to be discarded. As used herein, the term vacate encompasses a codeword exiting a buffer in order to be processed by a decoder, as well as a codeword exiting a buffer in order to be discarded or deleted.

In various embodiments, a variety of metrics may be used. The following figures show some example metrics and how they are used to manage a buffer. Although the examples below show decisions and certainties in the form of LLR values, any form or representation of decisions and certainties may be used. For simplicity, the following examples show buffers with 8 entries and 4 LLR values per codeword; in reality, dimensions of any size may be used.

FIG. 3 is a diagram showing an embodiment of a buffer in which a next codeword to be decoded is selected based on a number of unsatisfied parity checks. In some embodiments, second decoder output buffer 110 in FIG. 1 is implemented as shown. In buffer 300, metrics are in the form of a number of unsatisfied parity checks (see, e.g., metrics column 302). For example, an LDPC decoder checks a plurality of parity checks to see if the codeword being processed has been successfully decoded. If all parity checks are satisfied (i.e., there are 0 unsatisfied parity checks), then the LDPC decoder has successfully decoded the codeword. In this example, a first soft output decoder has indicated that it is ready for a next codeword. The partially decoded codeword with the fewest number of unsatisfied parity checks is selected in this example as the next codeword for decoding by the first soft output decoder. In this example, that is row 304 in buffer 300. A low(er) number of unsatisfied parity checks may tend to indicate a codeword is close to being successfully decoded, whereas a large(er) number of unsatisfied parity checks may tend to indicate that a codeword is not close to being successfully decoded and will require relatively many global/local iterations.

FIG. 4 is a diagram showing an embodiment of a buffer in which a codeword is preemptively discarded based on a number of unsatisfied parity checks. In some embodiments, second decoder output buffer 110 in FIG. 1 is implemented as shown. In this example, 7 of the 8 entries in buffer 400 are occupied and one or more entries will be selected to be preemptively discarded. As in the previous example, metrics column 402 includes the number of unsatisfied parity checks for each codeword.

In this example, the codeword with the most unsatisfied parity checks is selected to be discarded, in this case row 404. In some embodiments, any codewords with a metric above (below) a certain threshold are selected to be preemptively discarded. For example, if all codewords with 10 or more unsatisfied parity checks are selected to be discarded then row 404 is the only one that meets that criteria and is preemptively discarded. As described above, a large number of unsatisfied parity checks may indicate that the corresponding codeword is not close to being successfully decoded.

FIG. 5 is a diagram showing an embodiment of a buffer in which a next codeword to be decoded is selected based on an average of LLR magnitudes. In some embodiments, second decoder output buffer 110 in FIG. 1 is implemented as shown. In buffer 500, metrics column 502 stores the average of LLR magnitudes for a particular codeword. A first soft output decoder (not shown) has indicated that it is ready for a next codeword, and the codeword with the largest average value is selected for decoding processing in this example. In this particular example, that is row 504. As described above, for LLR values, the magnitude indicates a certainty that a decoder (e.g., an LDPC decoder) has in its decision for that particular bit or symbol. As such, a larger magnitude indicates a greater degree of certainty. In this example and the next example, LLR values range from −15 to 15, where a magnitude of 15 indicates that the soft output decoder is 100% certain in its decision and a magnitude of 0 indicates the soft output decoder has 0% certainty (i.e., the bit is an erasure or blank and the soft output decoder could not decide in favor of either a 1 or a 0 for that bit). In this particular example, the codeword with the largest average (i.e., row 504) is selected as the next codeword for decoding by a first soft output decoder because a large(r) average of LLR magnitudes corresponds to being closer to being successfully decoded.

FIG. 6 is a diagram showing an embodiment of a buffer in which a codeword is preemptively discarded based on an average of LLR magnitudes. In some embodiments, second decoder output buffer 110 in FIG. 1 is implemented as shown. At the point in time shown, 7 of the 8 entries in buffer 600 are occupied and at least one entry is to be preemptively discarded. In this particular example, the codeword with the lowest average of LLR magnitudes is selected to be preemptively discarded (i.e., row 604). A second soft output decoder (e.g., an LDPC decoder) had very little certainty in its decisions for that particular codeword and this is reflected in the low individual LLR magnitudes (i.e., 2, 1, 0, and 0) and the resulting average of LLR magnitudes. As described above, in some embodiments, all codewords having a metric below (above) a certain threshold are preemptively discarded.

The examples metrics shown in FIGS. 5 and 6 (i.e., an average of LLR magnitudes) may be generalized as an average of certainty values. In some embodiments, some other technique besides averages may be used, such using a median certainty value as the metric for a particular codeword.

Returning back to the example of FIG. 1, in some cases there is at least one codeword from the channel waiting in input buffer 102 and at least one partially decoded codeword waiting in second decoder output buffer 110. The following figures show some embodiments for deciding which codeword to select next for processing by first soft output decoder 104 in such situations.

Figure 7:
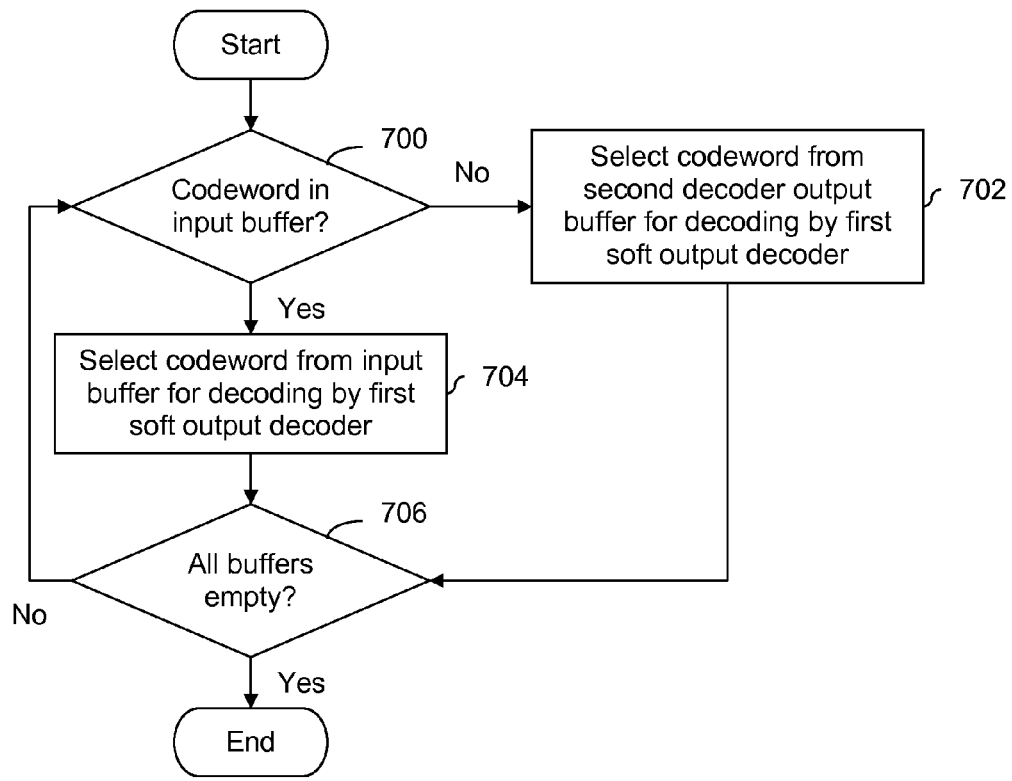
FIG. 7 is a flowchart illustrating an embodiment of a process for selecting a next codeword to be decoded by a first soft output buffer where preference is given to codewords from a channel stored in an input buffer.

FIG. 7 is a flowchart illustrating an embodiment of a process for selecting a next codeword to be decoded by a first soft output buffer where preference is given to codewords from a channel stored in an input buffer. At 700, it is determined whether there is a codeword in an input buffer. If so, a codeword from the input buffer is selected for decoding by a first soft output decoder at 704. In various embodiments, various techniques are used to select which codeword in the input buffer to process next. Some examples include a first-in, first-out (FIFO) technique, selecting based on a metric assigned to each codeword from the channel (e.g., a metric is generated for each codeword by a front-end processor), etc.

If there are no codewords in the input buffer, then a codeword is selected from a second decoder output buffer for decoding by the first soft output decoder at 702. For example, any of the techniques described above may be used. After selecting a codeword at 704 or 702, it is determined if all of the buffers are empty at 706. If not, it is determined if there is a codeword in the input buffer at 700.

Figure 8:
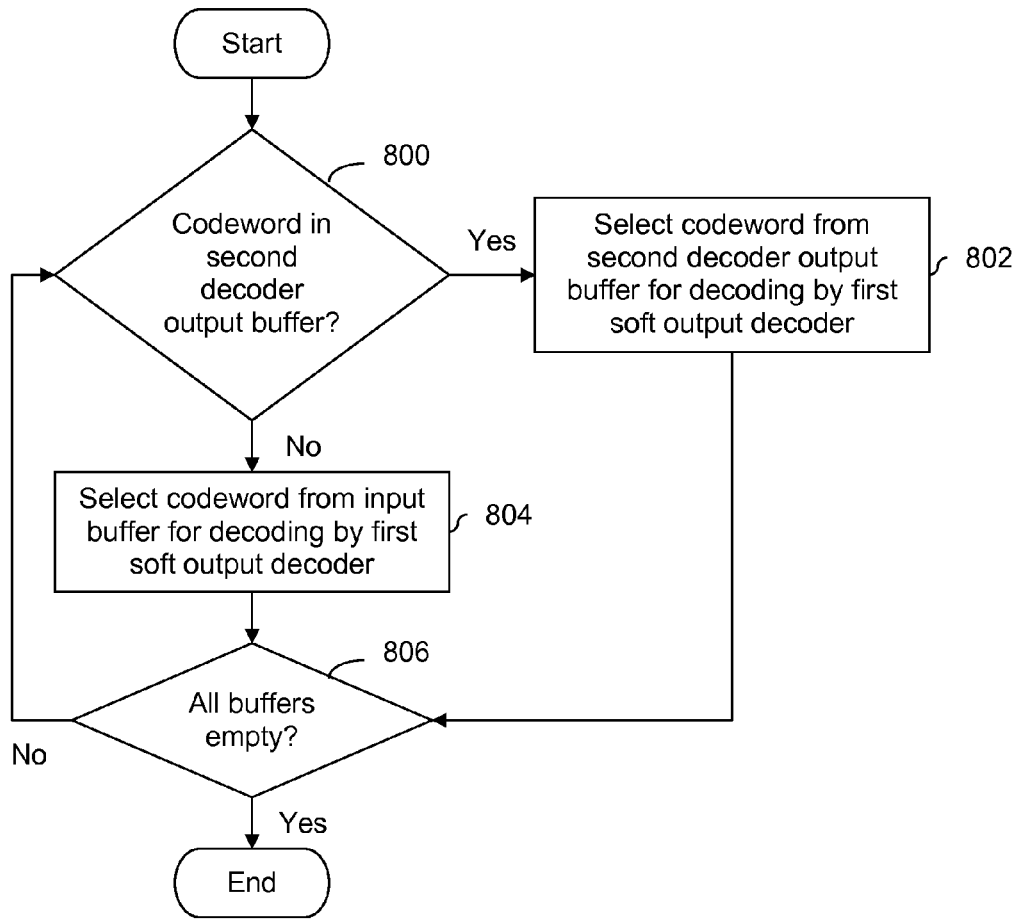
FIG. 8 is a flowchart illustrating an embodiment of a process for selecting a next codeword to be decoded by a first soft output buffer where preference is given to partially decoded codewords in a second decoder output buffer.

FIG. 8 is a flowchart illustrating an embodiment of a process for selecting a next codeword to be decoded by a first soft output buffer where preference is given to partially decoded codewords in a second decoder output buffer. At 800 it is determined if there is a codeword in the second decoder output buffer? If so, a codeword is selected from the second decoder output buffer for decoding by the first soft output decoder at 802. If there is no codeword in the second decoder output buffer, then a codeword is selected from the input buffer for decoding by the first soft output decoder at 804. After selecting a codeword at 802 or 804, it is determined if all buffers are empty at 806. If not, the process returns to step 800.

Figure 9:
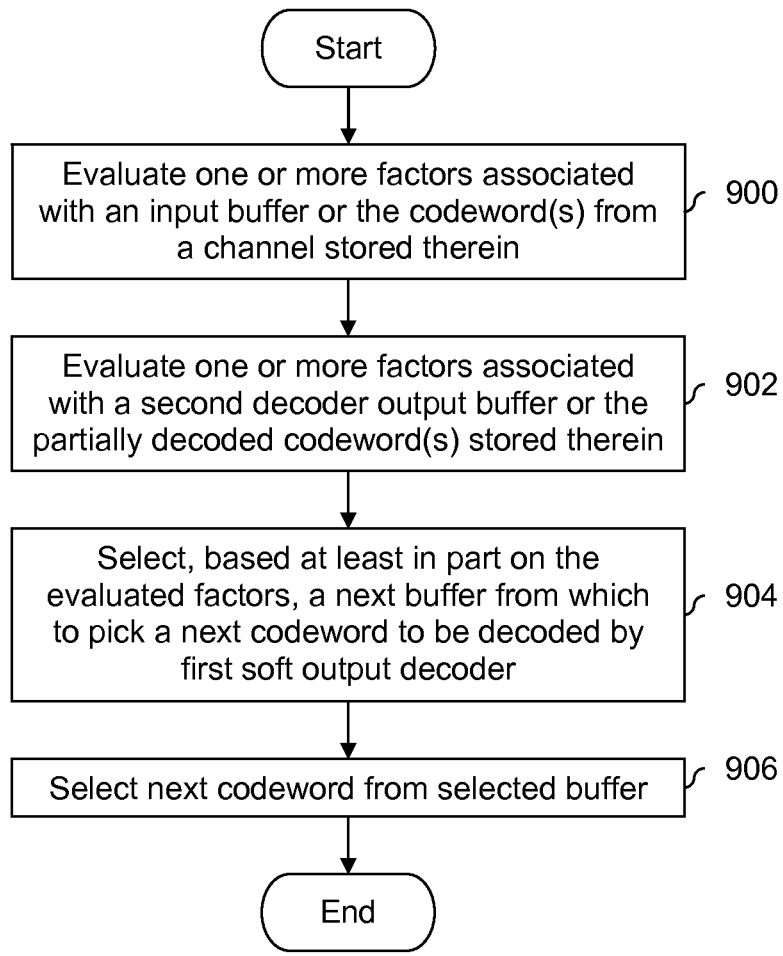
FIG. 9 is a flowchart illustrating an embodiment of a process for selecting a next codeword to be decoded by a first soft output buffer where factors associated with the buffers or codewords stored therein are considered.

FIG. 9 is a flowchart illustrating an embodiment of a process for selecting a next codeword to be decoded by a first soft output buffer where factors associated with the buffers or codewords stored therein are considered. In the example shown, a decision is made each time a first soft output decoder is ready to process a next codeword (i.e., a new global iteration starts). At 900, one or more factors associated with an input buffer or the codeword(s) from a channel stored therein are evaluated. In one example, each codeword has a metric generated for it and assigned to it (e.g., based on a quality of a received analog signal or resulting digitized signal as determined by a front-end processor). In another example, the factor relates to the input buffer as a whole. For example, the factor may be a number of occupied entries in the buffer, the occupancy percentage of the input buffer, or a number of times since the input buffer was last serviced (i.e., the number of consecutive times the second decoder output buffer was picked instead).

At 902, one or more factors associated with a second decoder output buffer or the partially decoded codeword(s) stored therein are evaluated. In some embodiments, these factors are in addition to or an alternative to the metrics described above. For example, the factors considered at 902 may be a number of occupied entries in the buffer, an occupancy percentage, or a number of times since the buffer was last serviced by a first soft output buffer.

At 904, a next buffer from which to pick a next codeword to be decoded by a first soft output decoder is selected based at least in part on the evaluated factors. In some embodiments, the buffers take turns so that neither buffer is starved (e.g., the input buffer is serviced first, then the second decoder output buffer is selected the next time the first soft output decoder is free, then the input buffer is picked the next time the first soft output decoder is free and so on). In some embodiments, if a buffer is close to capacity, then that buffer is serviced next. In some embodiments, the buffer having the codeword with the best metric is selected at 904. These are some example of how a next buffer is selected at 904; in some other embodiments some other technique is used.

At 906, a next codeword is selected from the selected buffer. For example, if the input buffer is selected, a FIFO technique may be used, or metrics may be used to select a codeword from the input buffer at 906. If the second decoder output buffer is selected at 904 then any of the techniques described above may be used at 906.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method, comprising:
obtaining a plurality of metrics associated with a plurality of partially decoded codewords, wherein:
the plurality of partially decoded codewords has been processed at least once by a first soft output decoder and a second soft output decoder; and
the plurality of partially decoded codewords is stored in a memory;
determining that a utilized storage capacity of the memory has reached a threshold;
in response to the determination that the utilized storage capacity of the memory has reached the threshold, selecting at least one of the plurality of partially decoded codewords based at least in part on the plurality of metrics; and
using a processor to instruct the memory to vacate the at least one selected codeword, wherein vacating the at least one selected codeword includes discarding the at least one selected codeword from the memory.

2. The method of claim 1, wherein the first soft output decoder includes a soft output Viterbi algorithm (SOVA) decoder.

3. The method of claim 1, wherein the second soft output decoder includes a low-density parity-check (LDPC) decoder.

4. The method of claim 1, wherein the plurality of metrics is associated with one or more of the following: a number of unsatisfied parity checks, an average of certainty values, a median of certainty values, or log-likelihood ratio (LLR) values.

5. The method of claim 1, wherein instructing the memory includes instructing the memory to pass the selected partially decoded codeword(s) to the first soft output decoder.

6. The method of claim 5, wherein:
the plurality of metrics is associated with a number of unsatisfied parity checks; and
selecting includes selecting a partially decoded codeword having the smallest number of unsatisfied parity checks.

7. The method of claim 5, wherein:
the plurality of metrics is associated with an average of certainty values; and
selecting includes selecting a partially decoded codeword having the largest average of certainty values.

8. The method of claim 1, wherein instructing the memory includes instructing the memory to delete the selected partially decoded codeword(s).

9. The method of claim 8, wherein:
the plurality of metrics is associated with a number of unsatisfied parity checks; and
selecting includes selecting a partially decoded codeword having the largest number of unsatisfied parity checks.

10. The method of claim 8, wherein:
the plurality of metrics is associated with an average of certainty values; and
selecting includes selecting a partially decoded codeword having the smallest average of certainty values.

11. A system, comprising:
a memory; and
a memory manager configured to:
- obtain a plurality of metrics associated with a plurality of partially decoded codewords, wherein:
  - the plurality of partially decoded codewords has been processed at least once by a first soft output decoder and a second soft output decoder; and
  - the plurality of partially decoded codewords is stored in the memory;
- determine that a utilized storage capacity of the memory has reached a threshold;
- in response to the determination that the utilized storage capacity of the memory has reached the threshold, select at least one of the plurality of partially decoded codewords based at least in part on the plurality of metrics; and
- instruct the memory to vacate the at least one selected codeword, wherein vacating the at least one selected codeword includes discarding the at least one selected codeword from the memory.

12. The system of claim 11, wherein the first soft output decoder includes a soft output Viterbi algorithm (SOVA) decoder.

13. The system of claim 11, wherein the second soft output decoder includes a low-density parity-check (LDPC) decoder.

14. The system of claim 11, wherein the plurality of metrics is associated with one or more of the following: a number of unsatisfied parity checks, an average of certainty values, a median of certainty values, or log-likelihood ratio (LLR) values.

15. The system of claim 11, wherein the memory manager is configured to instruct the memory including by instructing the memory to pass the selected partially decoded codeword (s) to the first soft output decoder.

16. The system of claim 15, wherein:
the plurality of metrics is associated with a number of unsatisfied parity checks; and
the memory manager is configured to select including by selecting a partially decoded codeword having the smallest number of unsatisfied parity checks.

17. The system of claim 15, wherein:
the plurality of metrics is associated with an average of certainty values; and
the memory manager is configured to select including by selecting a partially decoded codeword having the largest average of certainty values.

18. The system of claim 11, wherein the memory manager is configured to instruct the memory including by instructing the memory to delete the selected partially decoded codeword (s).

19. The system of claim 18, wherein:
the plurality of metrics is associated with a number of unsatisfied parity checks; and
the memory manager is configured to select including by selecting a partially decoded codeword having the largest number of unsatisfied parity checks.

20. The system of claim 18, wherein:
the plurality of metrics is associated with an average of certainty values; and
the memory manager is configured to select including by selecting a partially decoded codeword having the smallest average of certainty values.

21. A computer program product, the computer program product being embodied in a non-transitory tangible computer readable storage medium and comprising computer instructions for:
- obtaining a plurality of metrics associated with a plurality of partially decoded codewords, wherein:
  - the plurality of partially decoded codewords has been processed at least once by a first soft output decoder and a second soft output decoder; and
  - the plurality of partially decoded codewords is stored in a memory;
- determining that a utilized storage capacity of the memory has reached a threshold;
- in response to the determination that the utilized storage capacity of the memory has reached the threshold, selecting at least one of the plurality of partially decoded codewords based at least in part on the plurality of metrics; and
- instructing the memory to vacate the at least one selected codeword, wherein vacating the at least one selected codeword includes discarding the at least one selected codeword from the memory.

* * * * *